United States Patent [19]

Leigh et al.

[11] Patent Number: 5,282,213
[45] Date of Patent: Jan. 25, 1994

[54] COMPUTER-BASED LOGIC ANALYZER TIMING AND ANALYSIS SYSTEM

[75] Inventors: Kevin B. Leigh; Bruce A. Noe, both of Houston, Tex.

[73] Assignee: Compaq Computer Corporation, Houston, Tex.

[21] Appl. No.: 636,741

[22] Filed: Jan. 2, 1991

[51] Int. Cl.$^5$ .................... H04B 17/00; G06F 15/20; G06G 7/62
[52] U.S. Cl. .................... 371/22.1; 371/29.1; 364/487
[58] Field of Search .................... 371/22.1, 61, 29.1, 371/15.1; 395/575; 364/267, 267.2, 267.4, 267.6, 487

[56] References Cited

U.S. PATENT DOCUMENTS

| | | | |
|---|---|---|---|
| 4,654,848 | 3/1987 | Noguchi | 371/22.1 |
| 4,701,918 | 10/1987 | Nakajima et al. | 371/22.1 |
| 4,730,314 | 3/1988 | Noguchi | 371/22.1 |
| 4,924,468 | 5/1990 | Horak et al. | 371/22.1 |
| 4,972,138 | 11/1990 | Bush | 364/487 |
| 4,974,167 | 11/1990 | Anderson et al. | 364/487 |

OTHER PUBLICATIONS

Hewlett Packard HP16510A Logic Analyzer Front-Panel Operation Reference, Jan. 1988, pp. 5-1-5-42; 6-1-6-20; and 7-1-7-14.
Hewlett Packard HP16510B Programming Reference, Date Unknown, pp. 4-1-4-9 and A-1-A-15.
C. Terry "Front-End Tools Reduce Schematic Drudgery", Feb. 4, 1991, Electronic Data News, pp. 59, 61–62.
Tektronix Data Sheet for 92A90/92A90D Modules for Tektronix DAS-9200 Digital Analysis System, 1988.

Primary Examiner—Robert W. Beausoliel, Jr.
Assistant Examiner—Trinh Tu
Attorney, Agent, or Firm—Pravel, Hewitt, Kimball & Krieger

[57] ABSTRACT

A method and apparatus for performing signal interval timing analyses using a multi-channel logic analyzer and a host computer. Timing signal intervals to be measured are defined by an operator in a standard format. Timing signal interval data and sampling methodology is transmitted from the host computer to the logic analyzer. The logic analyzer captures and records the signal interval samples and transmits the samples to the host computer. The host computer translates the samples into a device neutral format, measures the time intervals for the samples and performs a statistical analysis on the measured intervals. The results of the statistical analysis, including range, distribution and mean values for the samples is graphically displayed.

26 Claims, 5 Drawing Sheets

FIG. 4B ns is highly# COMPUTER-BASED LOGIC ANALYZER TIMING AND ANALYSIS SYSTEM

BACKGROUND OF THE INVENTION

Field of the Invention

The present invention is directed to the testing and characterizing of electronic devices, in particular, to an automated method and apparatus for performing timing analysis tests on an electronic device and analyzing the data generated from such test.

Description of the Related Art

Analysis of timing of events of the various signals in a modern electronic device is a complicated and time consuming process. In the area of computer design, there are a number of signals which must be analyzed to ensure proper operation of the computer system. Operating speeds of various electronic devices have dramatically increased, making the timing of various signals more critical. Further, as more suppliers enter the market with electronic devices, compatibility with emerging standards also becomes a driving force behind timing analysis.

Logic analyzers are used in the characterization and analysis of various timing signals. The logic analyzers are multiple channel devices which are attached to a series of locations or signals on an electronic device to be tested. The device under test may include an individual integrated circuit, an operating circuit board, a subsystem or an entire system. The device under test is operated in accordance with a predetermined test program and generates various signals as a part of its operation. The logic analyzer tests for a preset condition or trigger to began recording of the signals generated by the device under test. The logic analyzer records the time interval between two or more signal events of interest. For example, the logic analyzer may be set to trigger when a signal A is in a logic high state and a rising edge transition is detected for signal B and measure the interval from this trigger event to the next rising edge of signal C. The logic analyzer captures and stores the timing information and displays the signals of interest on a screen for analysis by the person carrying out the test. The logic analyzer may also be capable of printing the captured image. The trigger event criteria may be manually loaded into the analyzer or may be communicated to the logic analyzer from an external source, such as a computer.

The operator of the logic analyzer must manually position two markers on the displayed waveform to indicate the beginning and end of the interval of interest. The logic analyzer will automatically measure the interval based upon the placement of the markers. The operator then compares the observed interval value with pre-established reference or specified values to determine if the device meets the specified timing requirements for that particular interval. Visual interpretation of the displayed signal waveform is required for the placement of the markers. This visual interpretation may result in the introduction of human error into the measurement and recordation of these results.

The above technique does not readily lend itself to measurements and the statistical analysis required to required to characterize device performance. Variations in interval timing may result from variation from loading, temperature or other variables. The number of recordings and the analysis must be made to determine the distribution of timing of various signals is highly labor intensive. Further, the recorded interval data must be subsequently subjected to statistical analysis to determine the distribution of signal timing characteristics under various conditions. As a result, timing analysis is often not performed to the extent necessary to fully characterize device performance over a range of conditions. As a result potential signal timing problems may not resolved and the device may be recommended for use in an unsuitable environment.

Therefore, it is desirable to automate the task of performing repeated measurement of selected signals for a desired triggering event and the signals to be analyzed. It is also desirable to provide a simple graphical output which provides a condensed representation of multiple timing samples developed under varying loads and conditions. It is further desirable that such a system be capable of receiving signal information from a variety of sources, such as logic analyzers, automated test equipment or simulators in various configurations, and with a variety of different devices to be tested.

SUMMARY OF THE INVENTION

The present invention is directed to a method and apparatus for automating the measurement and statistical analysis of signal timing events. The results of the analysis for the device under test may be graphically displayed in a simple output format which permits the operator to rapidly compare the device test results with reference standards.

In the present invention, a host computer is in signal communication with a logic analyzer, which is itself in signal communication with the device to be tested, known as the device under test. Further, the host computer may also be in direct signal communication with the device under test.

Signal measurement intervals to be measured and their associated triggering events are developed by a user, and may be stored either on the host computer or the logic analyzer itself. Further, test information specifying the type of tests to be carried out by the present invention may be pre-developed and stored on the host computer or the device under test.

The logic analyzer is capable of receiving interval, triggering and other sampling information from the host computer or other external source. The logic analyzer is also capable of capturing, recording and displaying multiple output signals generated by the device under test, based upon the triggering event. The output signals are comprised of channel or signal information, such as transitions and timing information. The triggering event causes the logic analyzer to sample or record the signal waveform until such time as the logic analyzer channel acquisition memory allocated to the particular channel is full. If the unit is re-initialized and waiting for another triggering event, all prior signal waveform information is flushed from the acquisition memory and the logic analyzer will again began to fill memory when triggered. The reoccurrence of the triggering event will not in itself re-initialize the logic analyzer. Thus, the logic analyzer will continue to sample even though the triggering event may occur multiple times during the sampling process. The above represents the method of waveform recording for a Hewlett-Packard HP/16500A logic analyzer. It is contemplated that other logic analyzers or testing device may acquire sample waveform information in a manner differing from hat set forth for the HP/16500A.

The present invention permits the user to specify the frequency and number of cycles to be analyzed from the recorded data. Thus, if four complete cycles are recorded during the sampling period, the user may specify that only the first or all four cycles are to be measured and used to characterize device performance. As the sophistication of logic analyzers increases, it is contemplated that the present intervals to be captured as to the specific occurrences of such cycles as opposed to capturing all cycles and selecting the cycles to be analyzed. The recorded sample data is transmitted to the host computer for analysis. The host computer is capable of storing the sample data as a disk file. Further, the host computer is also capable of transmitting the sample information back to the logic analyzer for subsequent display.

The logic analyzer may then receive new setup information from the host computer or other external source instructing it to capture and record other signal timing intervals.

Statistical analysis of the recorded sample data is performed on the host computer based on the recorded values. The statistical analysis may be performed utilizing existing commercial software or custom statistical analysis software. Statistical values currently obtained for the recorded values include sample minimum, maximum and mean observed values. It is contemplated that the statistical analysis may be expanded to develop additional statistical parameters as required for a specific application. The statistical information may be displayed in alternate forms. One form of display includes displaying the information as printed tabular data, setting forth the individual sampling records and the reference minimum and maximum values for the interval. An alternate method of display include a graphic display indicating maximum and minimum acceptable values, a range of observed sample values, mean sample values for each timing interval defined and the sample distribution.

The sample data may also be displayed and compared with reference sample data which displays the range of acceptable interval values. The presentation of the sample data and reference values is preferably by means of graphic representation with the reference values and sample values displayed adjacent to each other for ease of comparison.

The apparatus of the present invention also provides for transmission of new setup data from the host computer to the logic analyzer. The logic analyzer may be instructed to sample based on the new triggering events. The logic analyzer follows the previously described procedure and transfers the sample data to the host system for subsequent statistical analysis. Further, the present invention is capable of storing logic analyzer sample data on the host computer in a format which will permit the user to transfer the sample data back to the logic analyzer for subsequent display.

The present invention is such that once timing intervals and triggering events are defined and the logic analyzer connected to the device under test, a host computer can perform the entire sequence of transmitting new configurations, timing intervals and triggering events to the logic analyzer receiving, converting and storing sample data; determining when sufficient samples have been received; measuring the timing intervals for the specified cycles; performing statistical analysis on the sample data; and displaying the results of the statistical analysis without human intervention and in much less time when compared to performing the same tests manually.

BRIEF DESCRIPTION OF THE DRAWINGS

A better understanding of the present invention can be had when the following detailed description of the preferred embodiment is considered in conjunction with the following drawings, in which.

DETAILED DESCRIPTION OF THE PREFERRED EMBODIMENT

The present invention is directed toward an automated timing analysis test system capable of test data acquisition, interval measurement and statistical analysis of the sample data for the observed sample interval data.

Figure 1:
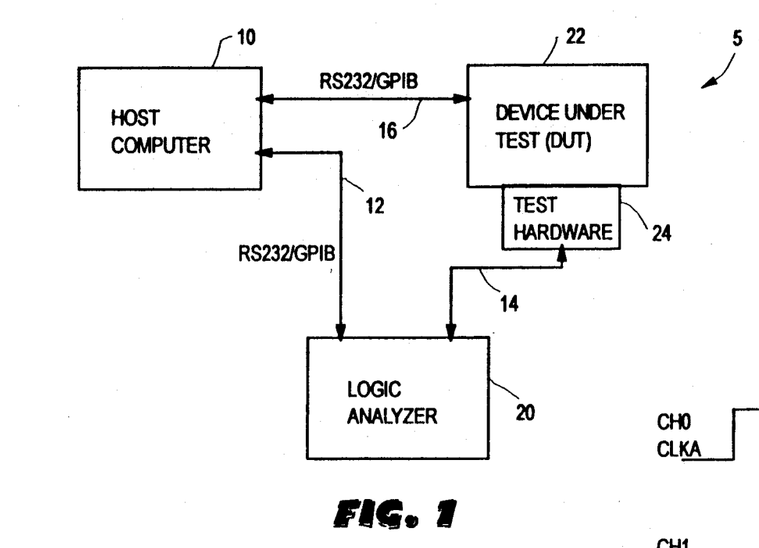
FIG. 1 is a functional block diagram depicting the components of the present invention and their interconnection.

Referring to FIG. 1, the apparatus of the test system 5 of the present invention is comprised of an Industry Standard Architecture personal computer operating as a host system 10. In the preferred embodiment, the host system 10 is based on an Intel 80286, 80386, 80386SX or 80486 microprocessor manufactured by Intel Corporation conforming to ISA standards, using Microsoft Corporation's MS-DOS operating system and having a minimum 640 kbytes of dynamic random access memory (DRAM), a floppy disk drive, a minimum 20 Mbyte hard disk drive, either Extended Graphics Array (EGA) or Video Graphics Array (VGA) display, and two serial communications ports. While the present embodiment requires the use of the MS-DOS operating system, it is contemplated that the present invention may be developed for use with other operating systems. Various data files are stored on the host system 10 to control operation of the present invention. The files include configuration information files for the host system 10 and other units within the system 5. Further, the host system 10 may also be used to store predefined test cycles, the specific test information, including test intervals of interest, a description of the unit under test, and the manner in which the tests are to be carried out. In the present invention, the test cycle files may be retrieved and interactively modified by the system operator to reflect changes in the system 5, the type of unit to be tested, the type of logic analyzer, the type of test to be carried out or other parameters which affect operation of the present invention.

Still referring to FIG. 1, the host system 10 is in communication with a multi-channel logic analyzer 20 via communications link 12. In the preferred embodiment, the logic analyzer 20 is a HP16500A Logic Analysis System, manufactured by Hewlett-Packard Company, and is used to obtain, capture and measure timing intervals generated by a device under test (DUT) 22. In the preferred embodiment, the communications link 12 conforms to either the RS-232C or the GPIB (IEEE 488) standard and the host system 10 and the logic analyzer 20 are both configured to support the selected RS-232C or GPIB mode signal communications.

The DUT 22 is in signal communications with the logic analyzer 20 using commercially available test hardware 24 components. The test hardware 24 includes the individual connectors, probes, a cabling 14. The test hardware 24 will vary with the DUT 22, the logic analyzer 20 and the particular tests to be carried out. Further, the logic analyzer 20 may be configured to utilize special test modules as part of the test hardware 24.

The DUT 22 is operated to generate the timing signals to be measured and analyzed. The DUT 22 is not generally a part of the present invention and may be any electrical device which generates timing signals which may be of interest. For example, the DUT 22 may also be a personal computer undergoing test prior to shipping. It is contemplated that where the DUT 22 is an intelligent device, it may be in signal communications with the host system 10 via communications link 16, where communications link 16 also conforms to RS-232C standards and both the DUT 22 and host system 10 are capable of supporting RS-232C mode signal communications. Further, it is contemplated that an intelligent DUT 22 would be capable of identifying itself to the host system 10. In this instance, either the host system 10 or the DUT 22 could select the proper predefined test cycles and configuration files, implement the selected configuration and carry out the predefined test cycle based upon identification information transmitted by DUT 22.

Figure 2:
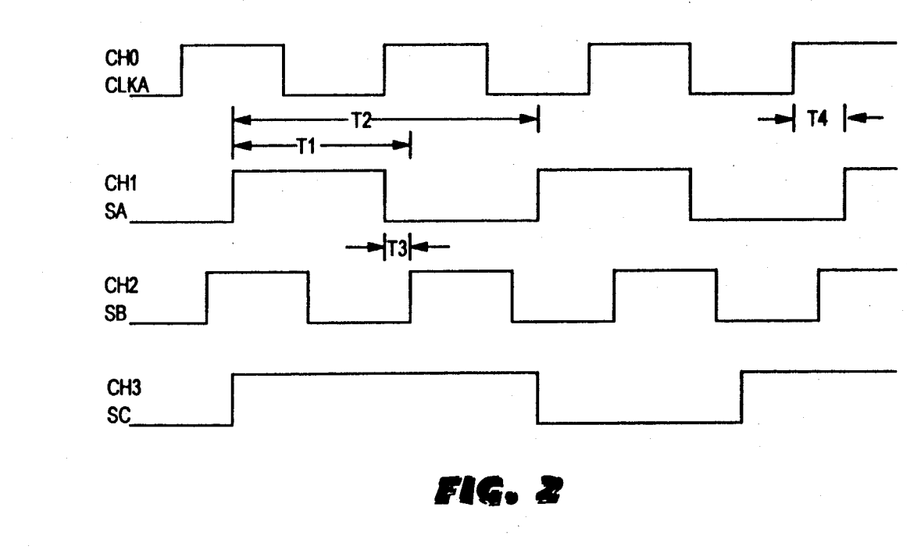
FIG. 2 is an illustrative timing diagram.

FIG. 2 is an illustrative timing diagram showing four signals, logic analyzer channels assigned to the signals and four different timing intervals of interest:

(1) T1: the interval between a rising edge of Signal A and the next rising edge of Signal B;
(2) T2: the interval between a rising edge of Signal A and the next rising edge of Signal A;
(3) T3: the interval between the first rising edge of CLKA after Signal C goes high and the next rising edge of Signal B; and
(4) T4: the Signal A delay from the last CLKA.

Traditional methods call for an operator to use a logic analyzer to visually search for each waveform to find the beginning and end points of the interval of interest. Further, the number of signals and the length of observation or time window that the operator may view on a logic analyzer screen is limited by the features, size and resolution of the logic analyzer. The operator marks the beginning and end of the interval and records the interval value from the logic analyzer display. The present invention permits the operator to specify the intervals of interest prior to performing the test. The present invention is further capable of automatically determining observed interval beginning and endpoints, calculating the observed interval value and recording the results without operator intervention.

Figure 3:
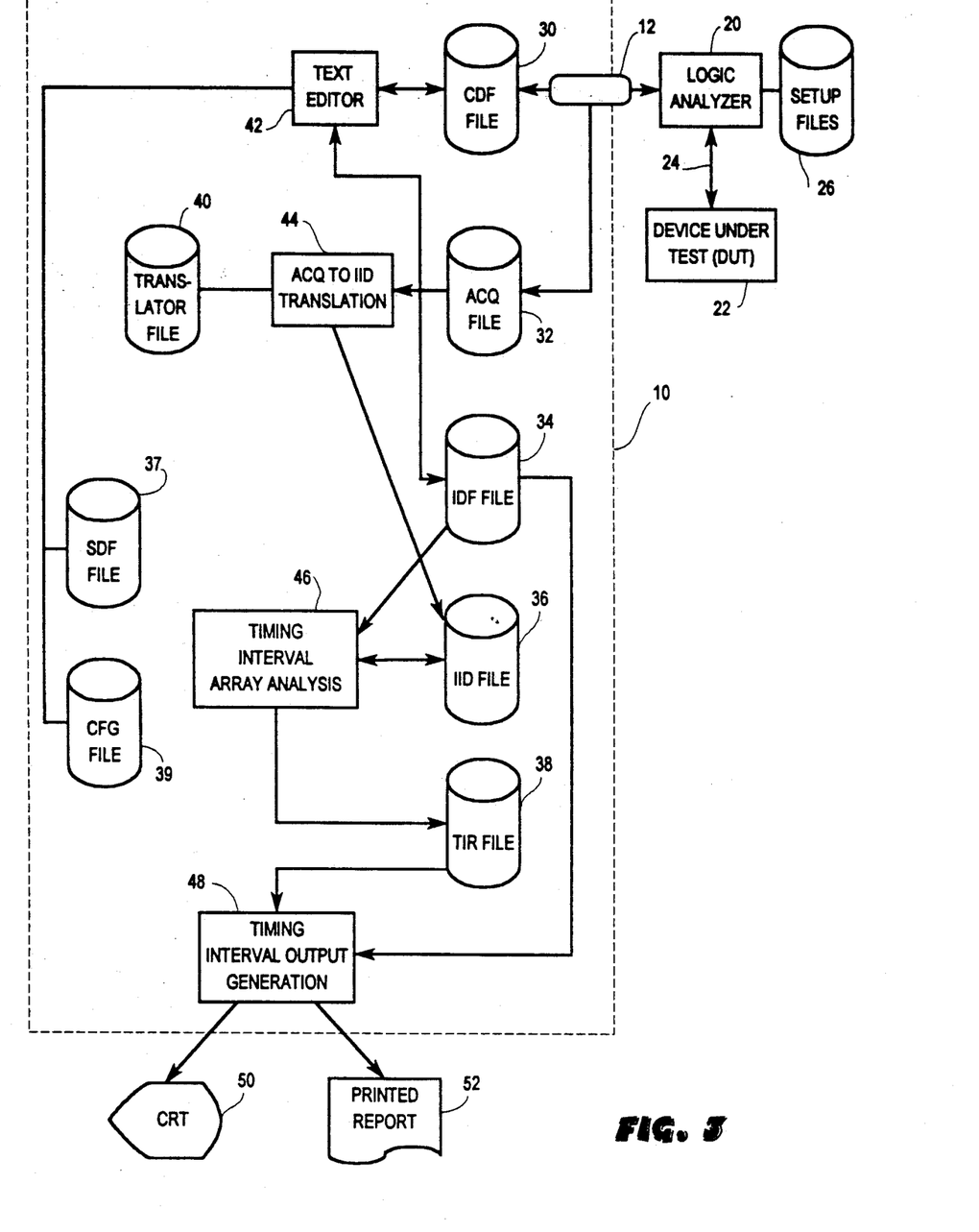
FIG. 3 is a diagram of the architecture of the present invention.

In order to describe the desired intervals to be measured, the present invention utilizes a nomenclature for defining timing intervals for a given test cycle, known as an Interval Definition File (IDF) 34 (FIG. 3). The IDF file 34 may describe a single interval to be tested or multiple intervals. The IDF file 34 specifies (1) the cycle name or label which describes the test cycle; (2) the logic analyzer channel assignment(s); and (3) interval description information.

The cycle name is a character string which is intended to identify the IDF test cycle and define its purpose. The present invention currently contemplates a logic analyzer 20 capable of monitoring up to 200 bus channels. As the sophistication of logic analyzers increases, the present invention may be adapted to increase the number of bus channels which may be monitored. A channel assignment is of the general format:

| << | (cc) | : | (ss) | >> | ; | comment |
| --- | --- | --- | --- | --- | --- | --- | where cc is an integer or range of integers which represent a single or range of bus and associated logic analyzer 20 channel(s) and ss is an alphanumeric designation the particular signal(s) assigned to a channel(s). The comment field is an optional field which may be used to describe the channel and is separated from the assignment field by a;. For example:

| << | 1 | : | −S0 | >> | ; | asserted: write |
| --- | --- | --- | --- | --- | --- | --- |
| << | 2 | : | −S1 | >> | ; | asserted: read |
| << | 3 | : | −RFSH | >> | ; | refresh |
| << | (4...11) | : | DATA(0...7) | >> | ; | data lines 0-7 |

In the above example, logic analyzer 20 channel 1 has been assigned to signal name −S0, which is the write asserted signal bus line. Similarly, logic channels 2 and 3 have been assigned to read asserted (−S1) and refresh (−RFSH) bus lines. The above example also demonstrates that multiple channel assignments may be made in a single line. Logic analyzer 20 channels 4 through 11 have been assigned to bus data lines 0 through 7.

The specific channel intervals must be defined in the present invention. The general format of an interval definition is:

[format] |bb| {rqt} | /* cc */

The [format] is a required field for an interval channel definition and will be described further below. The |bb| section of the interval definition is an optional field which defines the boundary or stopping point for an interval search. The {rqt} section of the interval definition is an optional field which may be used to define the timing interval adjustment, which may be used to compensate for variations in timing associated with the system 5. The "rqt" represents the adjustment option where:

r="−" negative adjustment (less delay) or ="+" positive adjustment (more delay)
q=adjustment value
t=delay units in fractions of a second: p (pico); n (nano); u (micro); m (milli); s (seconds).

The /* cc */ section of the definition is an optional alphanumeric comment statement where cc represents the textual character string.

The [format] section of the interval assignment includes the timing interval label and definitions and has the general format:

Txxxx {ytw, ytw} : str1 rel str2

Txxxx represents the timing interval label. T may be any alphabetic character and xxxx a postfix of up to four alphanumeric characters. The {ytw, ytw} section of the [format] is an optional section used to describe the range of acceptable measured values where "y" is an integer value, "t" is a time unit descriptor, following the format described in the "rqt" description above, and w is either a − or + to indicate minimum or maximum value, respectively.

The next section of the definition is comprised of two event markers which describe the interval of interest and the time line relation between the events. The "rel" represents the time line direction where "−>" indicates the timing data is searched forward in time from the triggering event and "<−" indicates that the timing is searched backward in time from the triggering event.

The string descriptors are used to define the beginning and end of the interval and utilizes a format which refers to five logic states:

L=logical 0
H=logical 1
U=transition from 0 to 1 (rising edge)
D=transition from 1 to 0 (falling edge)
E=transition, rising or falling edge In FIG. 2, each of the signals has been assigned a channel: CH0 has been assigned to CLKA; CH1 to Signal A; CH2 to Signal B; and CH3 to Signal C. Using the above logic states and channel assignments, the four intervals depicted in FIG. 2 may be defined as follows, where the numeral represents the channels and the letters represent the desired logic states:

T1 : 1U—>2U;
T2 : lU—>1U;
T3 : 0U.3H—>2U
T4 : 0U<—lU

T1 describes the interval for the next rising edge of CH2 (Signal B) following a rising edge of CH1 (Signal A). Similarly, T2 describes the next rising edge of CH1 (Signal A) following a rising edge of CH1 (Signal A). The beginning event for T3 occurs when a rising edge of CH0 (CLKA) is detected and CH3 (Signal C) is in a logic high state with the ending event of the interval to be the next rising edge of Signal B. In the above format, a "." in a string descriptor is used to indicate a conjunctive descriptor. In the above example, 0U.3H indicates a channel 0 rising edge when channel 3 is high. Multiple conjunctive descriptors may be used, for example, 4U.3L.6H would describe an event occurring when channel 4 has a rising edge, channel 3 is low and channel 6 is high. Referring again to FIG. 2, T4 describes how much earlier a rising edge CH0 (CLK) before the next rising edge CH1 occurs.

A second means of describing beginning or ending events for an interval is by reference to another previously defined interval. For example, an interval may be defined using the following format:

T19 : T6{BEGIN}—>3U.0H

The event at the start or the tail of the interval label T19 triggering event is the triggering event defined in interval T6. The string T6{END}would define the triggering event of interval T19 to be the end event of interval T6.

A third means of describing beginning or ending events is in terms of a particular pattern which occurs on a vectored bus. The bus event syntax is :

X(bus pattern)

The X refers to a bus channel label as described in the channel assignment above. The bus pattern is of the general format is:

dddddddr

Where d is a digit value and r is a radix value. The digit d may have a value of 0, 1 or x (don't care), where the radix r is defined as being binary (B). The digit d may take on a value 0–9, A–F or x (don't care) where the radix r is defined as being hexadecimal (H). The number of d's which appear in the bus pattern string is defined by the number of channels assigned to the bus channel label.

In some applications, the event of interest occurs when the bus pattern changes from a stable pattern. In this instance, the bus pattern is defined as DATA(?), specifies that the triggering event occurs when any one of the channel assigned values changes.

The /* cc */ section in the interval definition is an optional comment section.

The present invention permits the operator to define all intervals of interest using this format. Examples of interval definitions would be as follows:

[T16 : 4U —>5H]

[T1 {10n−, 200n+) : 5D.4H —>1D.OH]
 |T16{END}|{−5n}]

[T2 : −BE(DATA(?))<−T1{BEGIN}]

In the first example, interval T16 is defined as interval period which begins when a rising edge is detected on channel 4 and ends when channel 5 is high. In the second example, interval T1 is defined as having a minimum value of 10 and a maximum value of 200 nanoseconds. The beginning event occurs when a falling edge is detected on channel 5 while channel 4 is high. The ending event occurs when a falling edge is detected on channel 1 while channel 0 is high. Further, the interval search is not to go past the ending event for interval T16. Lastly, the interval has a 5 nanosecond delay to compensate for delays occurring as a result of test hardware.

In the second example, the interval is described as the beginning of interval T1 and searches backward to determine when a change in the bus pattern for bus channel assignment −BE (bus enable) occurs, thus detecting the setup time.

The host system 10 reads the IDF file 34 and transmits setup information and triggering event information to the logic analyzer 20. Thus, the triggering events for the intervals of interest are defined for the purposes of performing the test and later analysis. The logic analyzer 20 will record the sample data until the acquisition memory is full. The sample data file or acquisition file ACQ file 32 is transmitted by the logic analyzer 20 back to the host system 10. The ACQ file 32 is in a raw digital data form which is generally not readable by the operator.

Based on the information contained within the IDF file 34, the host system 10 will automatically place markers on the timing signals (which are imported from the ACQ file 32) for each cycle to be measured. As stated previously, the IDF file 34 may be used to specify which cycles within the sample are to be measured by host system 10. The host system will calculate the interval by counting the number of discrete points or bits between the markers and multiplying the number of points by the time base used during sampling. Thus, the host system 10 is capable of placing the markers and measuring the interval without operator intervention.

A better understanding of the operation of the method of the present invention may be had with reference to FIG. 3. FIG. 3 is a block representation of architecture of the apparatus of the present invention. Referring to the host system 10, a number of files are stored on the hard disk attached to the host system 10. While FIG. 3 depicts the ACQ file 32, IID file 36 and TIR file 38 as disk files within the host system 10, the host system 10 may store any one of the files in dynamic random access memory (DRAM) during the method of the present invention or, optionally, may store the above files as disk files for subsequent access and usage. Thus, it is understood that any references made as to storage of the ACQ 32, IID 36 and TIR 38 files is an option within the method and apparatus of the present invention.

The IDF file 34 defines each of the timing intervals to be measured for a given test cycle and consist of four major blocks of information: a file header, a channel assignment block, a cycle header, and the interval definition block, as described above. The file header block identifies the file name, file creator and creation date and the particular cycle to be tested. The channel assignment block is used to assign individual test signals to each of the available measurement channels. The cycle header block identifies the device interest cycle. The interval definition block defines each of the timing intervals in terms of the logic states of two or more associated test signals, as explained above.

The cycle definition file 30 (CDF) contains a summary of each of the predefined cycle test options stored on the host system 10. Each entry identifies the logic analyzer 20 set-up, IDF file 34, and TIR file 38 to be used in process. The timing interval record file 38 (TIR) is a file containing the measured results for one or more defined intervals acquired during a test cycle. The TIR file 38 may contain multiple records for a particular test cycle.

The acquisition data file 32 (ACQ) is a data file that is transferred from the source, generally a logic analyzer 20 to the host system 10. The ACQ file 32 contains the observed timing samples in a consistent data format. The data format is defined by the acquisition source and must be translated into a format which may be used by the host system 10.

The instrument independent data file 36 (IID) is a file containing timing samples in a predetermined format. The IID file 36 is created by the host system 10, which reads the ACQ file 32 and a translator file 40 and writes the translated data to the IID file 36. The translator file 40 is a software subroutine which is used by the host system 10 to translate the ACQ file 32 into an IID file 36. The host system 10 will read both the ACQ file 32 and the translator file 40 and perform the ACQ to IID translation 44, writing the results of the translation to the IID file 36. It will be appreciated that custom translator files will be required for various data acquisition sources, such as differing logic analyzers.

The System Definition File (SDF) 37 is used to define the host system and DUT 22 configuration associated with each TIR 38 file or sample acquired. The user may specify the type of host system, including memory, processor and speed, peripherals, such as hard disk capacity and video, as well as the operating environment and hardware. The SDF 37 file is intended to permit the user to recreate a prior test setup which resulted in the associated TIR 38 sample. Alternately, the user may interactively create a new SDF 37 file which may be used to describe a new host system and device under test setup.

The Configuration File (CFG) 39 is used to define an entire test procedure and permits the user to save all settings, thereby permitting a user to run an identical test at a later date without having to respecify all of the above files. Thus, the CFG file 39 will specify the logic analyzer setup files 26, the SDF file 37, and the ACQ 32, IDF 34, IID 36 and TIR 38 files to be used for the particular test. The CFG file also includes additional information relating to the logic analyzer, such as logic analyzer used, the type of printer used and test mode. The present invention has two general modes of operation. The analysis mode permits the user to perform analysis on already previously acquired waveform data. In the acquisition and analysis mode, the present invention is capable of acquiring data from the DUT 22 and performing the required analysis.

The above files represent the major files used within the method and apparatus of the present invention. These files are generally stored on the host system 10 hard disk.

Also installed as part of the host system 10 is an editor 42 which may be used by the operator to interactively modify or create a CDF file 30, SDF file 37, CFG file 39 or IDF file 34. The host system 10 is connected to logic analyzer 20 by means of RS 232 or GPIB interface 12. The logic analyzer 20 is connected to the device under test 22 by means of cabling 14 and test hardware 24. Also, connected to a logic analyzer 20 is a floppy or hard disk on which SETUP files 26 for the particular logic analyzer are stored. Alternatively, the SETUP files 26 may be stored on the host system (not shown) and transmitted to the logic analyzer as required. The CDF file 30 will include set-up information which specifies a particular set-up file 26 to be used by the logic analyzer 20 during operation of the present invention.

The logic analyzer 20 will capture the timing intervals generated by the device under (DUT) test 22 and store the information in memory, or alternatively on a hard disk or floppy disk, The stored data is transferred from the logic analyzer 20 to the RS 232 or GPIB link 12 to the ACQ file 32. The host system 10 will then read the ACQ file 32 and the translator file 40 to translate the ACQ to IID file 44 format. The host system 10 may optionally write the translated data to an IID file 36. The host system 10 performs a timing interval record array analysis 46. The host system 10 will create interval event markers in the host memory IID 36 signals based on the IDF file 34 data and measure the interval between the markers. The host system 10 then performs timing and statistical analysis 46 on the measured IID interval data, writing the results of analysis to the TIR file 38. The results of the analyzers may be displayed or printed in tabular or graphic format. The operator may select either graphical or textual output. The host system 10 may also read the TIR file 38 and the IDF file 34 and generate the output for the selected TIR file 38 in the output format selected by the operator. The textual output may be displayed either on CRT 50 or as a printer report 52. The graphical output may also be displayed on the CRT 50.

FIG. 3 is intended to represent the relationships between the various components of the apparatus of the present invention. It is not meant to describe the particular method which shall be described below in FIGS. 4A and 4B.

Figure 4A:
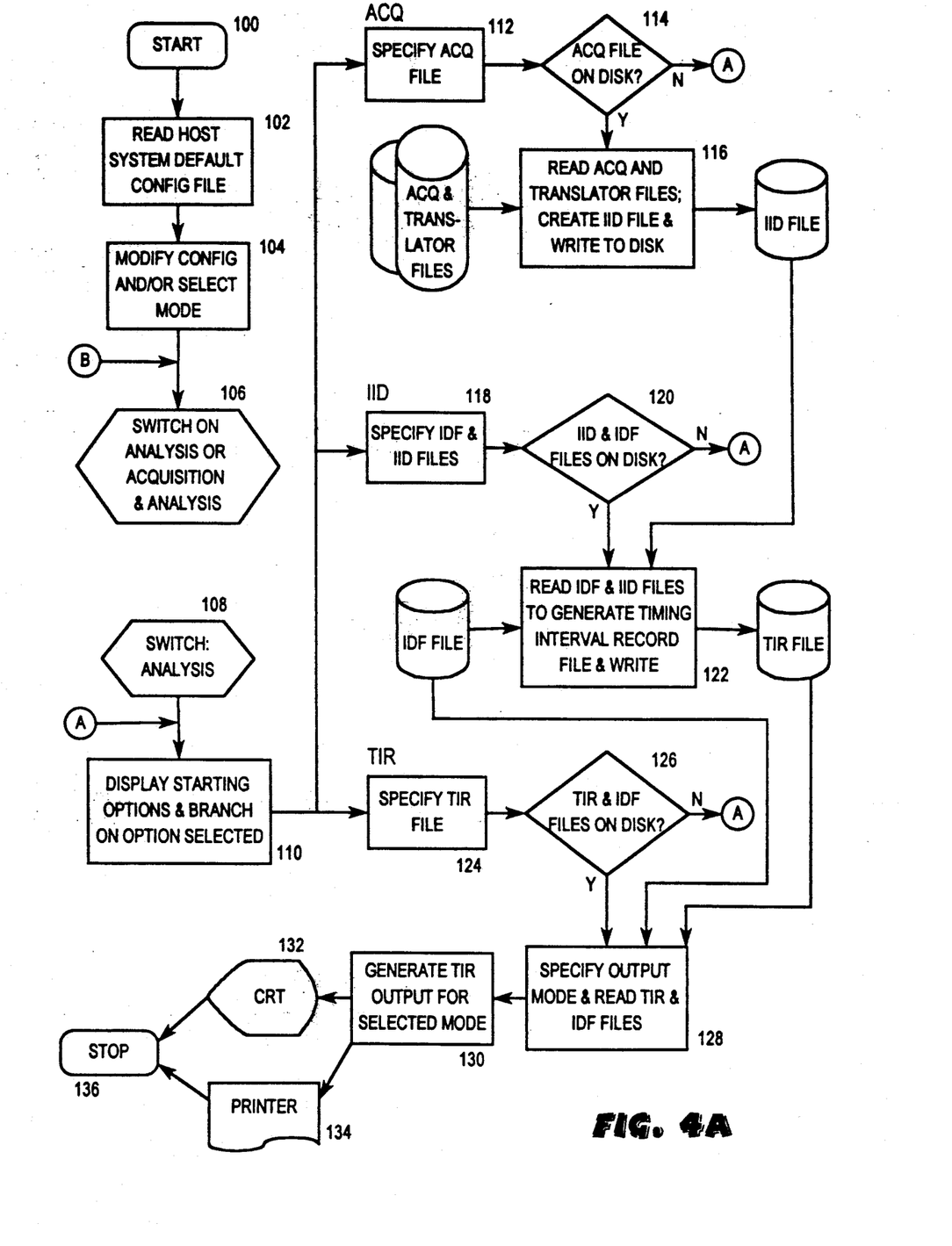
FIGS. 4A and 4B are flow diagrams of the manner of operation of the present invention.
Figure 4B:
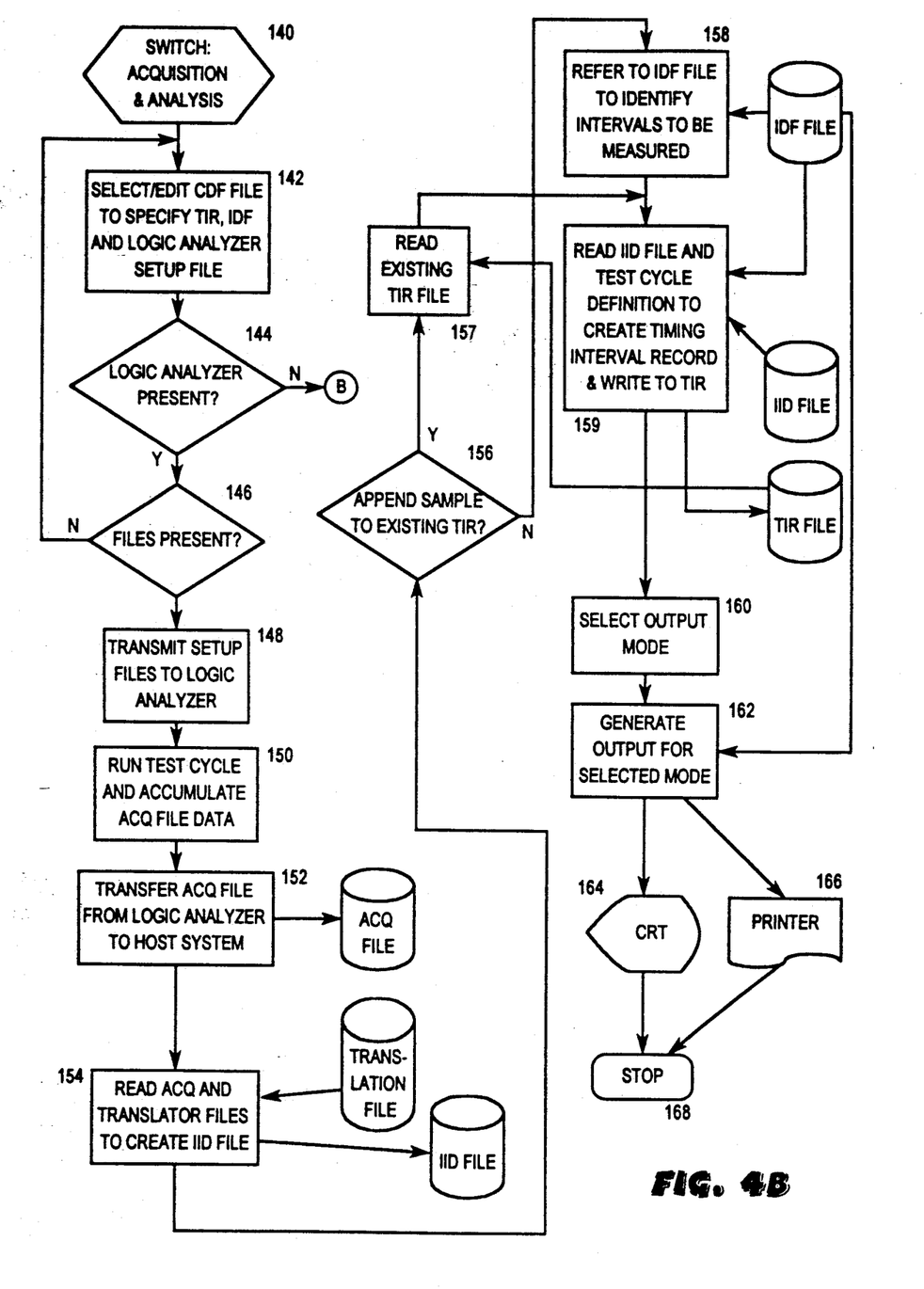

FIGS. 4A and 4B are flow diagrams depicting the operation of the present invention. Operation of the timing analysis tool (TATOO) begins at step 100. Control of the host system 10 transfers to step 102, wherein the host system 10 reads the default configuration file when the host system 10 is started. Control transfer to step 104 wherein the operator may modify any host system 10 configuration files, CDF files 30 or IDF files 34. The operator also selects the mode in which TATOO is to run. Control transfers to step 106 wherein the mode of operation of the present invention will switch on either analysis or acquisition and analysis mode. In the analysis mode, the present invention will read various existing files to perform the analysis on various timing intervals. In the acquisition and analysis mode, the present invention will acquire and build the data files as well as perform the analysis.

If the analysis mode is selected, control of the host system 10 switches to block 108. Control of the host system 10 transfers to step 110 wherein the host system 10 displays various starting options and permits the operator to select various files which are to be analyzed. Control of the host system 10 branches based on the particular option selected. If the operator selects to begin with an existing ACQ file 32, control transfers to step 112 wherein the operator specifies the particular ACQ file 32 for analysis. Control transfers to step 114 wherein the host system 10 determines whether the specified ACQ file 32 is present on host system 10. If the specified ACQ file 32 is not present on host system 10, control transfers back to step 110. If the specified ACQ file 32 is present on host system 10, control transfers to step 116 wherein the host system 10 reads the specified ACQ file 32 and the translator file 40 to create the IID file 36 and writes the IID file 36 to disk. Control then transfers to step 122. As noted during the discussion of FIG. 3, the operator has the option of writing the ACQ 32, IID 36 and TIR 38 files to a disk. Alternatively, the host system 10 may temporarily store the files in main memory during the steps of the method of the present invention. Accordingly, references made as to writing either the ACQ 32, IID 36 or TIR 38 files to disk is to be considered a user selectable option.

If in step 110 the operator selects to begin with an existing IID file 36, control transfers to step 118. In step 118 the operator specifies both the IDF 34 and IID 36 files. Control transfers to step 120 wherein the hosts system 10 determines whether the specified IDF 34 and IID 36 files are present on the host system 10 hard disk. If the files are not present, control transfers to step 110. If the IDF 34 and the IID 36 files are present on host system 10, control transfers to step 122 wherein the host system 10 reads the IDF 34 and IID 36 files. The host system 10 reads the IDF file 34 to determine the beginning and ending interval events for the interval and based on the events, places the markers and measures the timing intervals described in the IID file 36 for the interval of interest. The host system 10 also performs a statistical analysis to determine the range, distribution and mean values for the data contained within the IID file 36. The results of the statistical analysis are written to the TIR file 38 and control transfers to step 128.

If in step 110 the operator decides to begin with an existing TIR file 38, control of the host system 10 transfers to step 124 wherein the operator specifies the particular TIR file 38 to analyze. Control of host system 10 transfers to step 126 wherein the host system 10 determines whether the specified TIR file 38 exists on the host system 10 hard disk. If the TIR file 38 is not present on the host system 10 hard disk, control transfers to step 110. If the specified TIR file 38 is present on the host system 10, control transfers to step 128 wherein the host system 10 reads the IDF file 34 and TIR file 38 and the operator specifies the output mode. Control transfers to step 130 wherein the host system 10 generates the TIR output for the selected mode. Control may transfer to step 132 wherein the TIR file may be displayed as either graphical or tabular data on a CRT screen 50. The present invention is capable of displaying the sample information contained within the TIR file 38 and a predetermined nominal value as defined in the IDF file 34 simultaneously for easy comparison by the operator. Further, the present invention is capable of displaying multiple TIR files 38 and their associated nominal values. If a strictly printed form is desired, control transfers from step 130 to step 134, wherein the results of the TIR file 38 are printed. Control transfers to step 136, which ends the method of the present invention.

If at step 106 the acquisition and analysis mode is selected by the operator, control of the host system 10 transfers to switch 140 (FIG. 4B) which begins operation of the acquisition and analysis mode. Control of the host system 10 transfers to step 142 wherein the operator may select or edit an existing CDF file 30. Where the DUT 22 (FIG. 1) is interconnected to the host system 10, the DUT 22 may specify the CDF file 30 to be used for the particular test. Thus, the DUT instructs the host system as to the tests to be carried out. The CDF file 30 specifies the IDF file 34, the name of the TIR file 38 to be used and the logic analyzer set-up file 26 to be used. Further, the operator may interactively create a new CDF file 30 or IDF file 34.

Control of the host system 10 transfers to step 144 wherein the host system 10 tests whether the logic analyzer 20 is present and connected to the host system 10 via RS-232C or GPIB link 12. If not present, control of the host system 10 transfers to step 106. If the logic analyzer 20 is present, control of the host system 10 transfers to step 146 wherein the host system 10 determines whether the files selected by the operator in step 142 are present on the host system 10. If not present, control of host system 10 transfers back to step 142 wherein the operator may re-specify the files to be used. If the files specified are present, control transfers to step 148 wherein the host system 10 transmits the SETUP file 26 to the logic analyzer 20. Alternatively, the host system 10 may identify the SETUP file 26 to be used by the logic analyzer 20 where the SETUP file 26 is stored on the logic analyzer. The logic analyzer 20 will read the set-up file 26 specified in the CDF file 30 and load it into the logic analyzer 20. Control transfers to step 150 wherein the DUT 22 is activated. The logic analyzer 20 runs the test cycles specified in the CDF file 30 and acquires the data from the DUT 22 via cabling 14. The acquired data is written to an ACQ file 32 which is temporarily stored on logic analyzer 20. Control of host system 10 transfers to step 152 wherein the host system 10 instructs the logic analyzer 20 to transfer the ACQ file 32 from the logic analyzer 20 to the host system 10. The host system 10 periodically checks the status of the logic analyzer 20 to determine if the required tests have been completed before requesting transfer of the ACQ file 32. Control of the host system 10 transfers to step 154, wherein the host system 10 reads the ACQ file 32 and the translator file 40 to create the IID file 36 which is written to the disk in host system 10.

Control of the host system 10 transfers to step 156, wherein the host system 10 determines whether the sample data is to be appended to an existing TIR file 38. If yes, control of the host system transfers to step 157, wherein the host system 10 reads the existing TIR file 38. Control of the host system then transfers to step 159. If it is determined in step 156 that the sample data is not to be appended to an existing TIR file 38, control of the host system transfers to step 158. In step 158, the host system 10 refers to the IDF file 34 to determine the beginning and ending interval events for the interval and places markers in the IID file 36 based on the interval definition data in the IDF file 34. Control transfers to step 159, wherein the host system 10 places the markers for the beginning and ending interval events for the interval of interest in the IID file 36 and measures the timing interval for the event described in the IDF file 34. Where more than one interval has been recorded in the TIR 38 data structure, the host system 10 also performs a statistical analysis to determine the range, distribution and mean values for the data contained within the IID file 36. Alternatively, multiple samples IID file samples may be appended to each other to permit the host system 10 to perform the statistical analysis. Control of the host system 10 transfers to step 160, wherein the operator selects the output mode for the present invention. Control of the host system 10 transfers to step 162, wherein the host system 10 generates the output for the selected mode from the TIR 38 information contained within the data structure. If the selected mode is for a CRT, control transfers to step 164, wherein the TIR file 38 output may be displayed in either a graphical or tabular format. Control then transfers to step 168 which ends the method of the present invention. If in step 162 the operator selects a printed format, control transfers to step 166 wherein the TIR file 38 data is printed. Control then transfers to step 168 which ends the method of the present invention.

Figure 5:
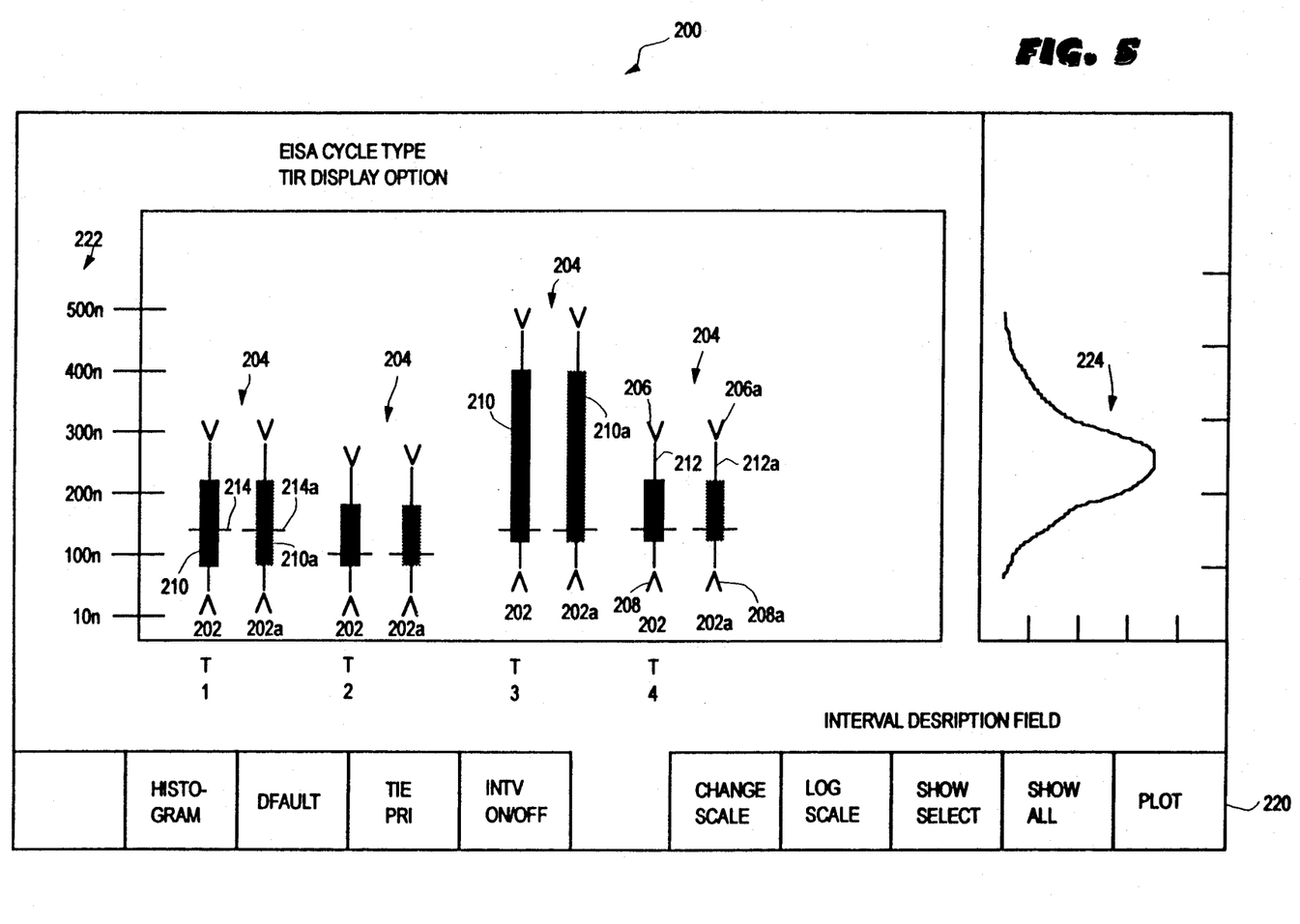
FIG. 5 is a representation of the graphic output of the timing interval sample data.

FIG. 5 is illustrative of the graphical display of the present invention. The display 200 appears on the CRT of the host system 10. In FIG. 5, two sets of interval data 202 are displayed for each of the intervals T1–T4. The darker primary interval data 202 for each interval represents the primary TIR file 38, that being the results of the current test. The lighter or secondary interval data 202a, which appears to the right of the primary interval data 202 represents the secondary TIR file 38a. The secondary interval 202a is displayed to permit a comparison of the primary interval 202 results with previously measured timing data as represented by interval data 202a. The secondary interval data 202a may reflect an observed normal distribution and mean for the particular timing interval 202 or may be used to compare the primary interval file 202 with an interval file for the same channel obtained under differing conditions. The present invention may also be used such that only primary interval data 202 for a particular timing interval file is displayed.

Referring still to FIG. 5, the down arrows 206 and 206a represent maximum values defined for the respective primary and secondary intervals, 202 and 202a. Similarly the up arrows 208 and 208a represent minimum defined values for the primary and secondary intervals, 202 and 202a. The wide vertical bars 210 and 210a describe the range of observed values for the primary and secondary intervals, 202 and 202a, respectively. The thin vertical bars 212 and 212a represent an acceptable value for the primary and secondary intervals, 202 and 202a, for which no value was observed. The horizontal bars 214 and 214a within the wide vertical bars 210 and 210a represent the mean observed values for each of the respective primary and secondary intervals, 202 and 202a.

On the bottom row of the display 200 is a selection menu 220, which corresponds to function keys on the keyboard of the host system 10. The operator may select to display the interval data in various forms utilizing the available commands displayed on the menu 220. The operator may alter the scale 222 or choose to select a particular interval and display it as a curve 224, showing the distribution of the observed values. Alternatively, the distribution may be depicted as a histogram (not shown). Thus, the present invention provides for a simple graphical means of displaying timing interval data. A title line 226 displays the name of the interval being displayed in the histogram distribution.

It will be appreciated that the present invention, by automating the process of defining the tests to be performed and the analysis of the sample data significantly decreases the time required to perform timing analysis tests. By automating the process of placing sample interval markers and performing statistical analysis on the sample data, the present invention removes any manual interpretation and computational errors associated with the test procedures. Further, the present invention may be adapted to make measurements from various data acquisition sources, such as other logic analyzers, automated test equipment and simulators, and in different formats. The ability of the present invention to place sample data in a common device independent format which may be used by the present invention.

The foregoing disclosure and description of the invention are illustrative and explanatory thereof, and various changes in the size, shape, materials, components, circuitry, wiring connections and contacts, as well as in the details of the illustrated circuitry, construction and method of operation may be made without departing from the spirit of the invention.

We claim:

1. An apparatus for analyzing signal timing waveform intervals generated by an electronic device, comprising:
   a host computer;
   a signal acquisition device in signal communication with said host computer and the electronic device for sampling and storing a plurality of signal waveforms generated by the electronic device;
   means for defining said plurality of signal waveforms to be sampled and stored by the signal acquisition device, including signal waveform beginning and ending events, in a signal definition file;
   means for configuring said signal acquisition device to enable said signal configuration device to sample and store said plurality of signal waveforms, including signal acquisition device triggering information to initiate sampling and defining the sampling cycles to be carried out;
   means for transmitting said plurality of signal waveform samples from said signal acquisition device to said host computer;
   said host computer measuring a plurality of signal waveform time durations for said defined signal waveforms in said signal waveform samples;
   said host computer generating statistical information from said measured signal waveform time durations; and
   means for presenting said statistical information.

2. The apparatus of claim 1, wherein said means for transmitting said signal waveform samples further includes means for storing said signal waveform samples in said host computer.

3. The apparatus of claim 1, wherein said host computer measuring said plurality of signal waveform time durations includes said host computer converting said signal waveform samples into a signal acquisition device independent format.

4. The apparatus of claim 3, wherein said host computer converting said signal waveform samples into a signal acquisition device independent format includes means for storing said signal acquisition device independent format samples in said host computer.

5. The apparatus of claim 1, wherein said signal acquisition device includes a multi-channel logic analyzer.

6. The apparatus of claim 1, wherein said signal acquisition device includes automated test equipment.

7. The apparatus of claim 1, wherein said host computer measuring said signal waveform time durations includes:
    said host computer reading said signal waveform beginning and ending events in said signal definition file;
    said host computer reading said signal waveform samples;
    said host computer marking said defined signal waveform beginning and ending events in said signal waveform samples; and
    said host computer measuring the time durations between said defined signal waveform beginning and ending events in said signal waveform samples.

8. The apparatus of claim 7, wherein said signal definition file includes signal waveform beginning and ending event range limitations and measurement instructions.

9. The apparatus of claim 7, wherein said signal definition file further includes signal acquisition device timing compensation information.

10. The apparatus of claim 1, wherein said host computer generating said statistical information includes said host computer determining distribution, range and mean information for said measured signal waveform time durations.

11. The apparatus of claim 1, wherein said means for configuring said signal acquisition device includes means for transmitting configuration information and said triggering information in a configuration file from said host computer to said signal acquisition device.

12. The apparatus of claim 11, wherein the electronic device is in signal communications with said host computer and the electronic device identifies said configuration file to be transmitted from said host computer to said signal acquisition device.

13. The apparatus of claim 1, wherein said means for configuring said signal acquisition device includes:
    means for instructing said host computer to identify a configuration file containing configuration information and said triggering information resident on said signal acquisition device; and
    means for instructing said signal acquisition device to read said configuration file.

14. The apparatus of claim 1 wherein said means for presenting said statistical information includes means for graphically displaying said statistical information.

15. The apparatus of claim 14, further including said host computer comparing said statistical information generated from said signal waveform samples with statistical information generated from another signal waveform sample.

16. The apparatus of claim 1, wherein said means for presenting said statistical information includes means for printing said statistical information.

17. A method for a host computer and a signal acquisition device to analyze a plurality of signal waveforms, the signal acquisition device sampling and storing signal waveform generated by an electronic device and being in signal communications with the host computer and the electronic device, the steps comprising:
    defining said plurality of signal waveforms to be measured, including signal waveform beginning and ending events in a signal definition file;
    the host computer configuring the signal acquisition device and transmitting triggering information to the signal acquisition device;
    the signal acquisition device sampling and storing said plurality of signal waveforms;
    transmitting a plurality of signal waveform samples from the signal acquisition device to the host computer;
    the host computer measuring a plurality of signal waveform time durations in said signal waveform samples;
    the host computer generating statistical information from said measured signal waveform time durations; and
    presenting said statistical information.

18. The method of claim 17, wherein the step of the host computer measuring said signal waveform time durations includes the step of the host computer converting said signal waveform samples into a signal acquisition device independent format.

19. The method of claim 17, wherein the step of the host computer measuring a plurality of signal waveform time durations includes the steps of:
    the host computer reading said defined signal waveform beginning and ending events in said signal definition file;
    the host computer marking said signal waveform beginning and ending events in said signal waveform samples; and
    the host computer measuring said signal waveform time durations between said signal waveform beginning and ending events in said signal waveform samples.

20. The method of claim 17, wherein said step of presenting said statistical information includes graphically displaying said statistical information.

21. The method of claim 20, wherein the step of graphically displaying said statistical information includes the step of graphically displaying said statistical information and said signal waveform definition.

22. The method of claim 20, wherein the step of graphically displaying said statistical information includes step of graphically displaying the range and mean information for said measured signal waveform time durations.

23. The method of claim 20, wherein the step of graphically displaying said statistical information includes the step of graphically displaying distribution information for said measured signal waveform time durations.

24. The method of claim 20, wherein the step of graphically displaying said statistical information includes the step of graphically displaying symbols indicative of range and means information for said signal waveform sample and the range and means information generated from another set of signal waveform samples.

25. The method of claim 20, wherein the step of graphically displaying said statistical information includes the step of graphically displaying symbols indicative of minimum and maximum signal waveform time durations.

26. The method of claim 17, wherein said step of presenting said statistical information includes printing said statistical information.

* * * * *

UNITED STATES PATENT AND TRADEMARK OFFICE
CERTIFICATE OF CORRECTION

PATENT NO. : 5,282,213
DATED : Jan. 25, 1994
INVENTOR(S) : Kevin B. Leigh, et al.

It is certified that error appears in the above-identified patent and that said Letters Patent is hereby corrected as shown below:

In col. 16, line 57, please delete "the".

In col. 16, line 68, please replace "means" with --mean--.

In col. 17, line 1, please delete "the".

In col. 17, line 1, please replace "means" with --mean--.

Signed and Sealed this

Twenty-third Day of August, 1994

Attest:

BRUCE LEHMAN

Attesting Officer     Commissioner of Patents and Trademarks